United States Patent [19]

Perkin

[11] Patent Number: 4,931,990

[45] Date of Patent: Jun. 5, 1990

[54] HARDENED BUBBLE MEMORY CIRCUIT

[75] Inventor: Bruce C. Perkin, 6205 Gyral Dr., Tujunga, Calif. 91042

[73] Assignee: Bruce C. Perkin, Tujunga, Calif.

[21] Appl. No.: 122,828

[22] Filed: Nov. 19, 1987

[51] Int. Cl.$^5$ .............................................. G11C 19/08
[52] U.S. Cl. .......................................... 365/1; 365/6; 371/13
[58] Field of Search ..................... 365/1, 6, 15; 371/13

[56] References Cited

U.S. PATENT DOCUMENTS

| | | | |
|---|---|---|---|
| 4,027,283 | 5/1977 | Tang | 365/15 |
| 4,031,374 | 6/1977 | Groudan et al. | 235/153 |
| 4,199,810 | 4/1980 | Gunckel et al. | 364/200 |
| 4,216,541 | 8/1980 | Clover et al. | 371/38 |
| 4,365,332 | 12/1982 | Rice | 371/13 |
| 4,394,763 | 7/1983 | Nagano et al. | 371/38 |
| 4,400,795 | 8/1983 | Irie et al. | 365/1 |
| 4,404,673 | 9/1983 | Yamanouchi | 371/13 |
| 4,413,327 | 11/1983 | Sabo et al. | 364/900 |
| 4,464,752 | 8/1984 | Schroeder et al. | 371/38 |
| 4,532,628 | 7/1985 | Mattews | 371/13 |
| 4,598,402 | 7/1986 | Matsumoto et al. | 371/38 |
| 4,612,640 | 9/1986 | Mehotra et al. | 371/51 |

Primary Examiner—James W. Moffitt
Attorney, Agent, or Firm—David L. Davis

[57] ABSTRACT

An economical circuit arrangement permits disruption, during a nuclear event or single event upset, of operation in portions of a bubble memory system and in a computer connected thereto while maintaining integrity of data stored in the bubble memory. Only critical portions of the bubble support circuits are radiation hardened, and a nonstop logic circuit is provided to continue operation during a nuclear event and to conclude any memory access cycles already in progress at the beginning of the event. Spurious (ionization induced) drive pulses are distinguished from actual pulses. A nuclear event detector generates an output pulse during the event and a delay is provided in a path of the pulses in the critical circuit portions. The delay is greater than the duration of the output pulse of the detector so that pulses arriving after the detector pulse are ignored.

18 Claims, 7 Drawing Sheets

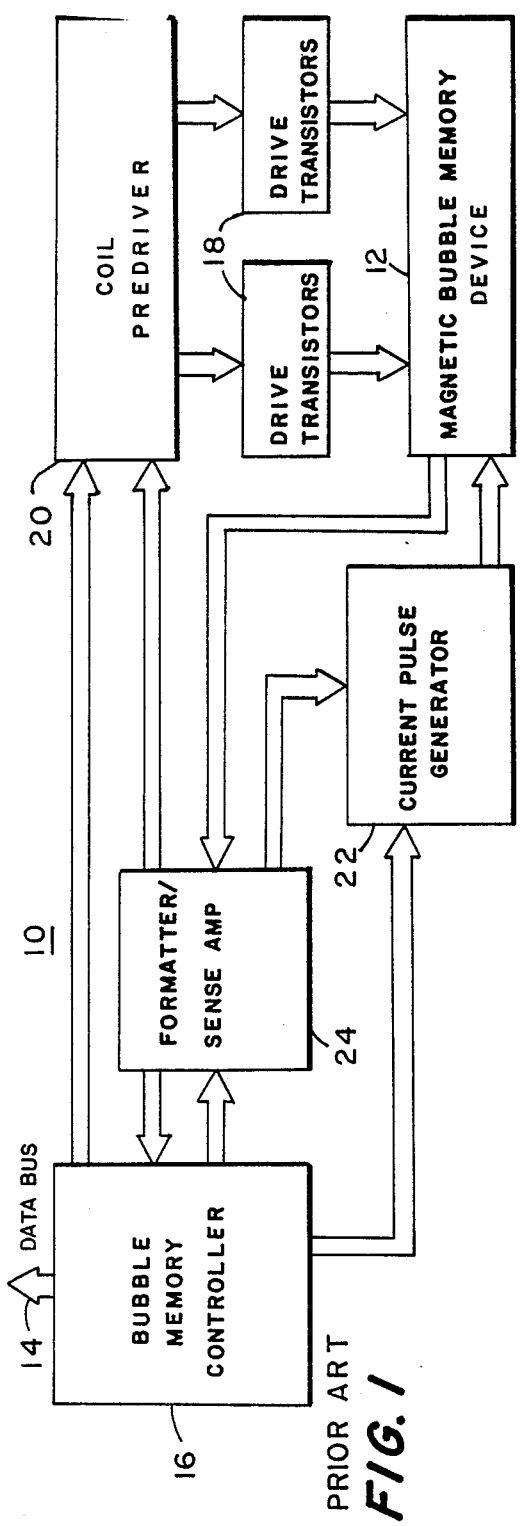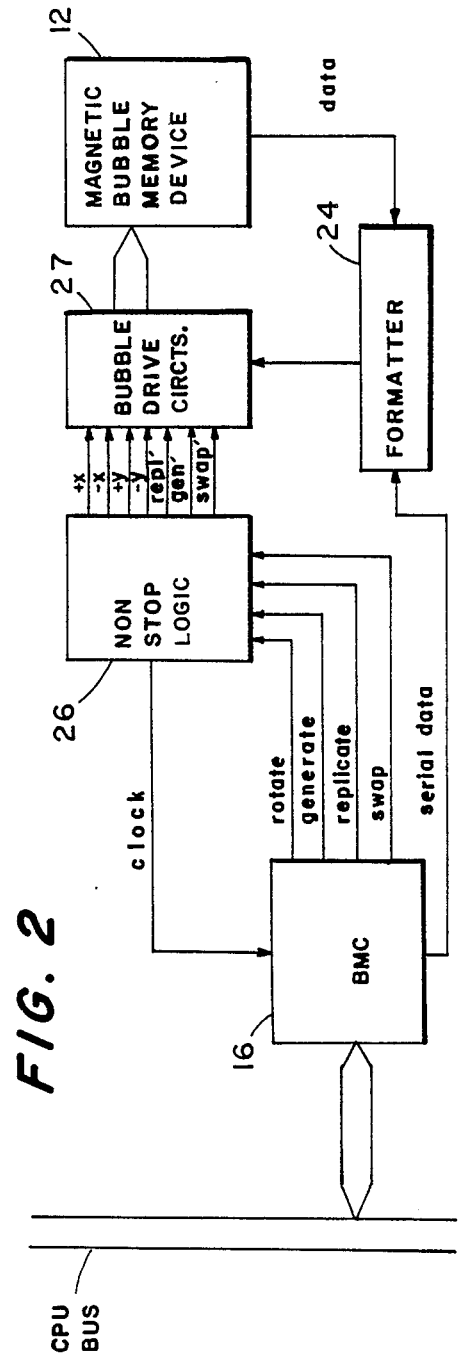

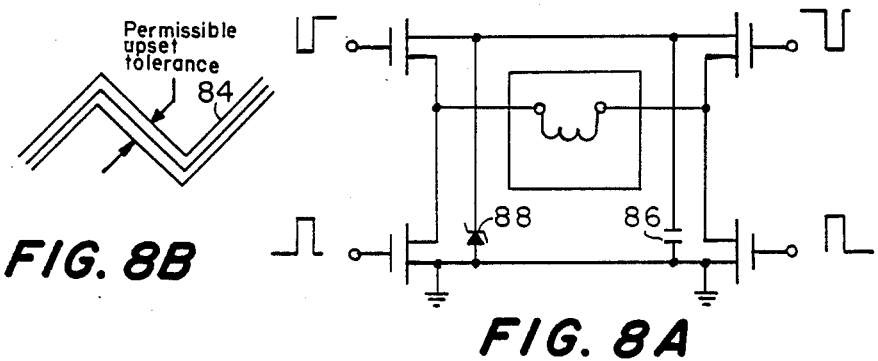
FIG. 8B
FIG. 8A
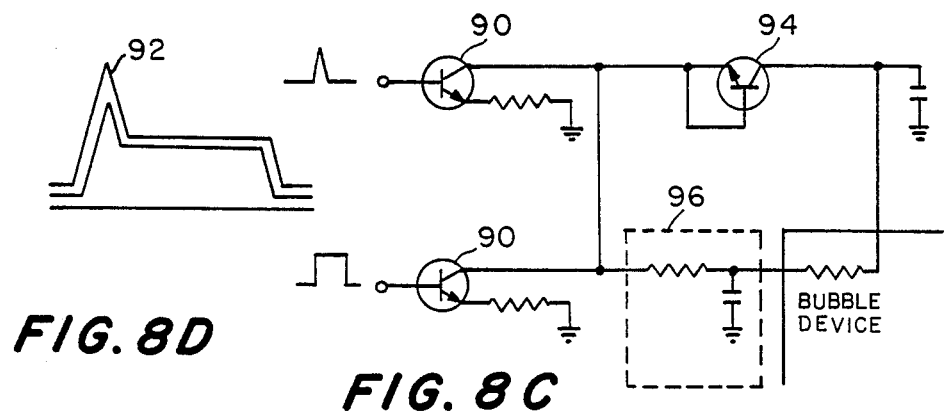
FIG. 8D
FIG. 8C
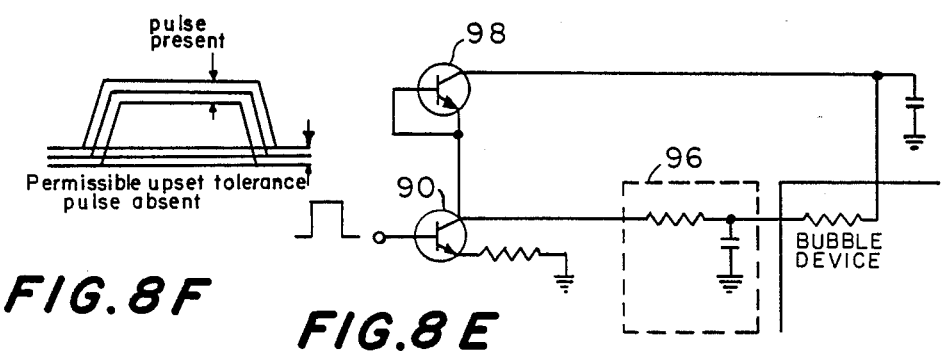
FIG. 8F
FIG. 8E

HARDENED BUBBLE MEMORY CIRCUIT

TECHNICAL FIELD

This invention relates to magnetic bubble memories, and more specifically to arrangements for securing data stored in bubble memories against destruction or modification due to effects of radiation on the supporting circuits used in conjunction with such memories.

BACKGROUND OF THE INVENTION

A standard magnetic bubble memory (MBM) system includes, in addition to the MBM device itself, a number of support circuits. These support circuits produce current pulses and timing for control of read and write operations, generate clocks for circulation of data around loops, convert the output signals to usable logic levels, and map out redundant loops from the device. Typically, the support circuitry includes a bubble memory controller (BMC), a function timing generator, a function driver, coil drivers and a sense amplifier used to detect the existence or absence of a bubble at the detector element.

The bubble memory controller (BMC) is typically used for interfacing the MBM system with a microcomputer. The BMC may include a controller integrated circuit IC, which typically includes a decoder, control registers and counters, a comparator, a FIFO (first-in, first-out buffer), a clock distributor and a microsequencer used to interpret a command and to initiate a sequence of control signals to execute a read or write data transfer operation. A function timing generator also forms part of the controller, and interfaces the controller with the coil drivers (which interface clock signals to the MBM), the function driver (which interfaces the function drive outputs of the function timing generator to the MBM), and the sense amplifier of the memory module.

The function timing generator generates coil drive signals, senses power failures, controls power down, and develops various of the precisely timed function signals needed during the read and write cycles to synchronize the operation of the several devices included in the bubble memory module. Thus, pulses produced by the function timing generator are converted to higher level voltages which are integrated by the driver coils to produce the desired triangularly shaped currents needed during reading and writing of the MBM and for moving the bubbles through the various tracks and loops of the device.

Such typical magnetic bubble memory devices are described in *Handbook of Semiconductor and Bubble Memories*, Walter A. Triebel, et al., Prentice Hall, Inc., Englewood Cliffs, N.J. 07632, 1982.

Since all operations which move, create, or destroy bubble data on the surface of the bubble substrate of a bubble memory are magnetically induced, such bubble memories are extremely reliable with respect to radiation and are not susceptible to radiation damage in view of the insensitivity of the magnetic domains to effects of radiation. That is, for radiation to affect the stored bubble data it must either generate a magnetic field or modify the garnet material sufficiently to spoil its magnetic properties. Neither of these conditions exist for practical nuclear or single event particle conditions. Since no electric field or electric amplification exists in the device, no particle radiation (or ionizing radiation) can generate the current necessary to modify the bubble patterns. Moreover, the garnet medium is similarly undamaged by total ionizing dose and by neutron fluence, which would damage any semiconductor device.

However, the various external support circuits of a bubble memory, which produce magnetic fields for controlling the bubbles stored in the device, are sensitive to ionizing radiation, whether viewed as an ionizing radiation transient or as a single particle event. Thus, for bubble memories, which are moving data memories rather than moving media memories, either degradation or upset caused by the effects of radiation on the support circuitry may be catastrophic, even for single upsets of short duration.

The prior art has generally attempted to solve the problem of radiation sensitivity by attempting to insulate circuits from, rather than permitting circuits to operate in the presence of, such ionizing radiation. Thus, thinner and purer gate oxides have been used to reduce radiation sensitivity of NMOS IC logic used in bubble chip sets. CMOS circuit technology has overtaken NMOS logic, and is inherently harder (more insensitive to radiation damage) than is NMOS circuitry.

However, whether CMOS or NMOS circuitry is involved, both total radiation dosage and dose rate must be considered in hardening bubble memories to the effects of radiation.

In one prior art attempt to overcome the above noted dose rate problem, redundant bubble devices have been used. Therein, all critical data is stored in two sets of bubble devices, with one set left unpowered at any given time. If data in one set is scrambled, data from the second set is used. One illustration of memory redundancy to provide radiation protection is disclosed in Sabo, et al., U.S. Pat. No. 4,413,327. Therein, memories are interrupted during an event and a safe memory provided to an update circuit after conclusion of the event.

However, such approaches suffer from three distinct disadvantages. The added storage capability increases overhead circuitry. The increased overhead may approach 100% if all data are considered critical Moreover, because it is necessary to re-write completely the scrambled bubble device, including reconstruction of the bootloops thereof, recovery from radiation exposure is slow when redundant bubble memories are used. Finally, until complete data reconstruction is performed, the system is vulnerable to a second nuclear event.

In another approach to hardening of bubble memories, the prior art has attempted to assure that the logic states controlling the bubble device are never upset. However, to implement such an approach several thousand flip-flops are required to store the bubble memory state during a nuclear event. Thus, the prior art approach to avoidance of upset in the logic states of a MBM, and the loss of data associated therewith, is quite costly in hardware requirements.

In order to provide the desired degree of nuclear hardness, however, the inventor hereof has concluded that it is necessary to design a bubble chip set which will assure that minimum acceptable parameters are met for a minimal number of critical drive functions of the bubble memory. Further, in order to limit the scope of the problem to be solved, and thus to limit the costs and overhead associated with the solution, it is necessary to provide continuous certainty and reliability for only those functions critical to the storage of data. That is, various field generating functions treated as critical may be protected, while various other functions associated with the bubble memory may be treated as noncritical and are thus only required to work properly before and after a nuclear transient, but not during such an event.

The prior art has failed to recognize this concept, and has accordingly provided expensive redundancies to various circuits. Some of the prior art approaches to hardening a storage to the effects of radiation are described below.

In U.S. Pat. No. 4,031,374 of Groudan, et al., assigned to the assignee hereof, there is disclosed circumvent circuitry for limiting all currents in a memory access network of a plated wire or magnetic core memory during a radiation event. The disclosed arrangement thus provides correction of single word errors in a memory environment wherein only the word being read or written may be lost. However, for a MBM environment loss of a single word in a magnetic bubble memory is tolerable. On the other hand, if a critical function is disrupted, the entire memory may become useless. Accordingly, the '374 patent does not address the problems described herein and avoids only the loss of a single word. In the present invention, however, the entire memory is protected by completion of a rotation cycle, for example, or by protection of other critical functions. Moreover, in the '374 patent, circumvent circuitry currents are limited in all selection lines to less than one-half the select current. In the present invention, in order to complete the rotation cycle the drive currents are maintained at, or close to, the appropriate full drive levels.

In U.S. Pat. No. 4,464,752 of Schroeder, et al., similarly assigned to the assignee hereof, there is described a 5 ms annealing period, during which a memory is clamped, and a recovery period to reconstruct data so that an individual word may be reconstructed, in a writing or reading operation. Specific circuitry is required to assure complete hardness, and the clamp period is extended to variable time. Flags are used to indicate that the memory was cycling during a radiation event, thus raising the possibility that data may have been lost. This prior disclosure, however, does not relate to a bubble memory and thus does not rely on the inherent radiation insensitivity of the storage itself. By providing multiple word error corrections in random time periods, correction is provided for data altered during a multiple nuclear event sequence However, no suggestion may be derived from the disclosure that only a limited number of function generating circuits be protected, such as circuits for assuring that an access cycle be completed and for inhibiting only subsequent SWAP cycles. Nor may a suggestion be inferred therefrom to harden only the drive circuits or to harden such circuits by a specific approach, as described herein.

Thus, by attempting to attain a goal of complete reliability of both volatile and nonvolatile data, and by seeking to provide nuclear hardness for each of the memory devices as well as the circuits associated therewith, the prior art has overlooked a simpler, and less expensive, solution to radiation problems for bubble memories which are inherently insensitive to radiation. The prior art has ignored the fact that no alteration of nonvolatile bubble data will occur due to a nuclear event, provided that a minimal number of criteria are met. The art has, more specifically, overlooked the possibility of providing different degrees of protection to different portions of the support circuitry provided for a bubble memory in order to safeguard completely the data stored in the memory.

SUMMARY OF THE INVENTION

It is accordingly an object of the present invention to reduce the sensitivity of bubble memories to the effects of radiation, and particularly to immunize the support circuitry thereof to such radiation-induced effects.

It is a more specific object of the invention to provide different degrees of protection to different portions of the support circuitry provided for a bubble memory in order to provide radiation hardness to the memory and to the data stored therein.

It is a further object of the invention to immunize a bubble memory circuit to catastrophic failures caused by a single event upset by detecting a nuclear event and halting further bubble memory access until termination of the event, thereby maintaining the integrity of the bubble memory system and the data previously stored therein while permitting data in transit to and from the system to be lost and while permitting the remainder of the bubble memory system and the computer connected thereto to be completely disrupted.

It is a more particular object of the invention to provide a bubble memory support circuit wherein nonstop logic is provided for maintaining, during a nuclear event, proper operation of only those circuits generating critical fields affecting interpretation of data storage in the entire device.

Still another object of the invention is to provide a state machine for completing during a nuclear event a rotate command, possibly including also a generate, swap or replace command, independently of any action by the bubble memory controller.

It is yet another object of the invention to complete an ongoing access cycle of a bubble memory upon detection of a nuclear event, and to inhibit subsequent cycles therein until detection of termination of the event.

A more detailed object of the invention is to provide a simple state machine, comprised of fewer than 20 flip-flops, for improving radiation hardness of a bubble memory by completing an ongoing cycle of the memory while inhibiting generation of or response to any further cycles until detection of recovery of the support system from a nuclear event.

Yet another object of the invention is to reduce impact of ionization induced photocurrents on selected drivelines of a bubble memory by utilization of small geometry drive transistors therefor.

It is a further object of the invention to render ineffective during a nuclear event those pulses potentially capable of generating free bubbles by shorting excessive pulse amplitudes.

It is an additional object of the invention to short excessive pulse amplitudes and to reduce driveline transients on generate and replicate lines by providing therein a large geometry inactive transistor arranged for shorting out the driveline current in response to an ionizing pulse applied thereto.

Still a further object of the invention is the provision of a nuclear event detector for terminating access to a bubble memory system upon detection of occurrence of a nuclear event, in combination with a nonstop logic system for maintaining operation of critical fields during the event to avoid catastrophic loss of data.

An additional object of the invention is the provision of a capability to detect single event upset that would affect either the addressing of bubble memory data or storage of redundant loop data.

A further, and more particular, object of the invention is to maintain integrity of data stored in a bubble memory experiencing a nuclear event by preventing generation of swap pulses after a nuclear event until recovery of the overall system.

Yet another object of the invention is to discriminate between transient swap pulses, induced in the controller by a nuclear event, and actual, functional, swap commands operationally generated by the controller.

Still another object of the invention is to provide a delay in a circuit used for transmitting a swap pulse to the bubble memory device, the delay being in excess of the duration of a response pulse generated by a nuclear event detector, thereby to permit a logic circuit to reject the delayed swap pulse when such a pulse arrives after the response pulse of the nuclear event detector.

In accordance with these and other objects of the invention, there is provided a radiation hardened magnetic bubble memory including a bubble memory device. The memory further includes a bubble memory controller for tracking and controlling movement of data in, input of data to, and output of data from the bubble memory device. Bubble drive circuits are included, the circuits being responsive to the bubble memory controller for providing field generating currents for the bubble memory device. Significantly, a nonstop logic unit is connected between the bubble memory controller and the bubble drive circuits for passing control signals generated by the bubble memory controller to the bubble drive circuits. The nonstop logic includes a radiation hardened terminating apparatus, responsive to detection of occurrence of a nuclear event, for assuring that a rotating magnetic field applied to the bubble memory device prior to occurrence of the nuclear event completes a full rotation and for preventing initiation of a further rotation thereof until termination of the nuclear event.

The nonstop logic is thus operable for providing internally generated field rotation signals to the bubble memory device in response to detection of a nuclear event, whereby data stored in the bubble memory device is reliably returned to a known accessible state in the presence of a nuclear event.

Preferably, the nonstop logic is also operable during a nuclear event for blocking replicate and generate fields from being generated in response to the bubble memory controller, thereby ignoring data errors occurring in data input to or output from the bubble memory device during a nuclear event.

Still further, the nonstop logic includes a device for passing replicate and generate field signals generated by the bubble memory controller to the bubble memory device only in the absence of a nuclear event. Still more particularly, the nonstop logic includes a radiation hardened swap signal generator for providing an internally generated swap field generating signal to the bubble memory device only when a swap signal from the bubble memory controller has been verified. Towards that end, the swap signal generator includes logic for verifying a swap signal generated by the bubble memory controller and circuitry for producing the internally generated swap field generating signal upon verification that the swap signal is provided in a time interval different from an interval of a nuclear event.

In accordance with one aspect of the invention, a nuclear event detector is included for detecting a nuclear event and generating an event signal indicative thereof. The nuclear event detector is operable for generating the event signal after a time period no longer than a predetermined maximum time period. A delay is provided in a swap signal line from the bubble memory controller to the nonstop logic for delaying a swap signal by a delay which is at least as long as the predetermined maximum time period.

In accordance with another aspect of the invention, there is provided an improved magnetic bubble memory, the improvement including hardening means for hardening only critical drive signals for a bubble memory device of the memory. The hardening means includes a nonstop logic operable for assuring that a rotating magnetic field applied to the bubble memory device prior to occurrence of the nuclear event completes a full rotation thereof, and for preventing initiation of a further rotation thereof until termination of the nuclear event.

In the nonstop logic, a storage is included for storing a complete set of signals designating a complete set of X and Y field strengths to be provided to the bubble memory device for rotating a magnetic field therein through a full rotation. A counter is triggered by a rotate signal generated by the bubble memory controller and is responsive to a clock signal for accessing the set of X and Y field strengths in sequence and providing signals representative thereof to a bubble drive circuit. Logic is provided, responsive to a predetermined count of the counter and to the event signal generated by the nuclear event detector, for stopping the counter at the predetermined count for a time period during which the event signal is being generated by the nuclear event detector.

The transmitter used to transmit the generate and replicate signals from the bubble memory controller to the bubble drive circuit preferably includes means responsive to the nuclear event detector for transmitting the generate and replicate signals to the bubble drive circuit only when a nuclear event is not detected.

A parity circuit may be connected to an address counter of the bubble memory controller, for preventing writing into erroneous addresses after a single event upset.

The parity circuit may include a parity generator for generating a parity code for addresses generated by the address counter and a parity tester for testing parity of an address applied to the bubble memory device The tester is thus operable for generating a signal indicating a parity error to disable accessing an addressed location of the bubble memory device.

A redundant loop register fault detector is included, the fault detector associated with a formatter of the magnetic bubble memory. Preferably, the fault detector includes a counter for counting a number of loops being used, the counter being triggered by a start cycle signal Means is provided for outputting a loop count fault signal when an end cycle signal does not coincide with an indication by the counter of a count corresponding to the number of loops.

In accordance with yet another aspect of the invention, there is provided a circuit arrangement for minimizing in the bubble memory device photocurrents generated by nuclear events. The minimizing circuit arrangement includes small geometry drive transistors, having geometries capable of conducting current levels substantially equal to peak currents required thereof, thereby incorporating in the minimizing circuit drive transistors having ratings approximately equal to the peak currents.

Additionally, a large geometry semiconductor device substantially shunts an output of a small geometry drive transistor. The large geometry device is connected in a normally OFF condition and is capable of generating a large photocurrent in response to a nuclear event. Thus, the large geometry device is operable for shunting from the bubble memory device increases in current generated by the small geometry transistor photocurrents induced therein by a nuclear event.

Additionally, a limiter is included for limiting currents in the bubble memory device to be within predetermined tolerances of nominal values thereof The limiter preferably includes a matched transistor pair, including a first constant current transistor driving a current through the bubble memory device, and a second transistor, substantially matched to the first transistor and shunting a photocurrent approximately equal to the photocurrent output of the first transistor from the bubble memory device The matched second transistor is thus operable for shunting from the bubble substantially all nuclear event induced photocurrent generated by the first transistor.

A passive filter may be included for eliminating photocurrent spikes generated in the small geometry drive transistors, the filter operable for shunting the photocurrent spikes to ground prior to introduction to the bubble memory device.

In the described minimizing and limiting circuitry for the photocurrent, the large geometry semiconductor device is incorporated in a replicate or generate signal drive circuit of the bubble drive circuit and the matched first and second transistors are incorporated in a swap signal drive circuit of the bubble drive circuit Thus, the swap signal provided to a bubble is maintained within predetermined tolerance levels and the replicate or generate signals are maintained at levels which are equal to or less than predetermined maximum acceptable values therefor.

Other objects, features and advantages of the present invention will become readily apparent to those skilled in the art from the following description wherein there is shown and described a preferred embodiment of the invention, simply by way of illustration and not of limitation of one of the best modes suited to carry out the invention. As will be realized upon examination of the specification and from practice of the same, the present invention is capable of still other, different, embodiments and its several details are capable of modifications in various obvious aspects, all without departing from the invention. Accordingly, the drawings and the descriptions provided herein are to be regarded as illustrative in nature and not as restrictive of the invention.

BRIEF DESCRIPTION OF DRAWINGS

In accordance with the above described objects and features of the invention, a preferred embodiment thereof is shown in the accompanying drawing, wherein:

FIG. 1 shows a typical arrangement of a magnetic bubble memory and the supporting circuitry therefor;

FIG. 2 shows a modification of a magnetic bubble memory in accordance with an embodiment of the present invention;

FIGS. 8A-8F show arrangements for hardening driver circuits of the system of FIG. 7.

DETAILED DESCRIPTION

Figure 3:
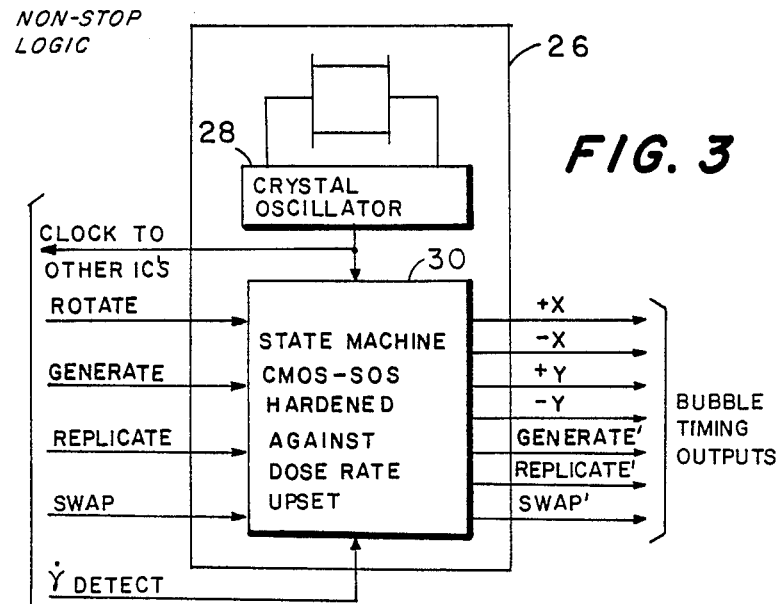
FIG. 3 illustrates the nonstop logic component of the embodiment of FIG. 2.

As noted in the foregoing, the inventor hereof has observed that hardness for data stored in a MBM may be inexpensively attained by safeguarding only a minimal number of functions associated with the bubble memory, which are considered as critical. Other functions, considered noncritical, do not need to be safeguarded.

For example, it is necessary to assure that, once initiated, the X-Y field, which is used to propagate bubbles in the device, will continue to function to completion without error throughout a nuclear event. Such a requirement is imposed since a major disturbance to the vector magnetic field, or to its smooth rotation about 360 degrees, is capable of scrambling all of the data stored in the device This criticality of the X-Y field is due to the fact that incomplete propagation will advance some bubbles forward and will not advance others. If such an inconsistency ever occurs, the entire device will be hopelessly scrambled Such a result indeed occurs in nonhardened support circuits from a radiation induced timing logic upset or from a drive current error.

Further, the swap field generated by current in the swap driveline must remain reliable The swap field is capable of entering data into the nonvolatile data storage loops. Each incorrect pulse on the swap driveline may scramble a single page of stored data. Thus, if the bubble data is to remain 100% valid, the swap driveline must be accurately driven for all transient conditions. However, reliability of the data relative to the swap signals relates to avoidance of applying the swap signal to the driveline in a time when the signal may have been erroneously generated, such as during a nuclear event.

From another perspective it is noted that data in the data or bootloops can be altered by transfer of bubble data into the loops due to a SWAP pulse or by generation of extraneous bubbles which find their way to, and settle in, the data loops. Since only one line can cause a swap to occur, this line (the swap line) should be carefully controlled.

For the above noted critical fields and signal lines, whether an erroneous result is caused by a transient failure, due to dose rate or single event upset, or is caused by a failure due to accumulated exposure, the consequence is the same: essentially complete scrambling of the data for one page or for the entire MBM.

It is also noted that the Z field must be driven to provide proper temperature compensation any time the X-Y field is present. However, the replicate and generate fields, which affect only data in transit, are less critical than the X-Y and swap fields since nonvolatile data is not affected thereby. Similarly, errors in sensing of bubble output, or errors in writing to the input loops of the device would have no consequence, providing that the system may be made to disregard the erroneous data upon occurrence of a nuclear transient Further, although precise frequency control is not required, and thus it is unnecessary to provide a stringent tolerance for a clock source (such as a crystal oscillator) for the bubble memory, it is necessary to assure that the clock continue to oscillate, at least throughout completion of the cycle.

In addition to the above-noted protection for the field generation circuits, the ionizing current pulses must not seriously disturb the bubble drive current amplitudes. Although techniques for reducing the impact of radiation induced photocurrent are known, these techniques have not been used by the prior art in the drive current generators for bubble memories, particularly in the critical drive current generators hereinabove identified.

Thus, it is necessary to provide different degrees of protection to different portions of the support circuitry provided for a bubble memory.

Referring now to FIG. 1, a magnetic bubble memory arrangement according to the prior art is generally shown at 10. In this arrangement, a bubble memory module 12 communicates with a data bus 14 of a control microprocessor (not shown). A plurality of such modules is typically provided in combination to form a large capacity memory. A bubble memory controller (BMC) 16 provides an interface between the control microprocessor and the bubble memory module 12. All communications between the microprocessor and the memory module 12 is performed through the BMC 16, which generates all timing and control signals for use by the bubble modules.

A chip set available from Intel, for example, may be used to form the arrangement of FIG. 1, wherein the memory module 12 is a bubble memory assembly identified by number 7114, BMC 16 is available under designation 7225, drive transistors 18 for the memory module are available as IC number 7254, a coil predriver 20 is available as IC number 7250, a current pulse generator 22 is available under the designation 7234, and a formatter/sense amplifier 24 is designated by IC number 7245.

As has been hereinabove described, a nuclear event may cause the internal logic of the BMC to become scrambled and result in loss of bubble data due to uncontrolled coil and driveline currents. Accordingly, in the arrangement of FIG. 2, nonstop logic 26 is used, the nonstop logic unit being hardened to effects of radiation Thus, the BMC 16, in the configuration of FIG. 2, is primarily used to initiate the various bubble drive sequences, while nonstop logic 26 is used to continue and terminate the sequences so that each sequence proceeds to completion under control of the hardened logic In FIG. 2, bubble drive circuits 27 represent the functions performed by drive transistors 18 and coil predriver 20.

As will be described with respect to the embodiment of FIG. 7, the bubble drive circuits 28 themselves may be hardened, as well as the nonstop logic 26.

In order to provide still further hardening of the memory, parity is added to operation of a page counter in BMC 16, in order to prevent writing into the wrong address after occurrence of a single event upset (SEU). Similarly, in formatter 24, a counter is added to count the number of 1's in the redundant loop register. If the number counted by the counter does not equal the number of data bits in the bubble page, a modification has been caused by a SEU and the data is unreliable.

These aspects of the invention are shown in greater detail in FIGS. 5 and 6, described hereinbelow.

Referring now to FIG. 3, shown therein is a detail of the nonstop logic 26. To ensure synchronous operation, timing is achieved by use of a hardened crystal oscillator 28. Since the clock is required to work through a gamma pulse, for example, a low precision type oscillator may be used, without requiring the critical bias levels which cause high precision oscillators to be stopped by a gamma pulse.

In accordance with the invention, the nonstop logic 26 is formed of a state machine 30. In operation, the state machine looks for the leading edge of a Y+ signal as an indication to start coil rotation. As described below, for each such indication the state machine proceeds, automatically, to complete one 360-degree rotation.

As will be appreciated from the present description of the invention, the arrangement of the bubble memory of FIG. 2 divides functional areas of the magnetic bubble memory into two groups. A first group, such as relating to the generate and replicate drive systems, performs functions which may be interrupted and can be shut down momentarily. The second group, including the rotate and swap generators, includes the minimal circuitry which must perform its function continuously through an event.

To attain the desired operation, known in the art as "workthrough," hardened logic IC's may be used, as well as minimization of transistor photocurrent (radiation induced currents) and photocurrent compensation.

During experimental investigations, it was found that hard data errors resulting from drive circuit problems were possible only from the following causes:

a. incomplete propagation resulting from improper X-Y coil drive;
b. wrong data stored by a transient induced swap pulse; or
c. free bubbles could be generated and contaminate data loops if swap, generate or replicate drive were severely disturbed.

It is accordingly concluded that errors in sensing bubble output or errors in writing to input loops during a nuclear event would have no consequence, provided the system disregards such data upon occurrence of a nuclear transient. Accordingly, a well known nuclear event detector, such as made by the IRT Corporation of San Diego and available under designation HSN 3000, for example, is used in conjunction with the nonstop logic. The nuclear event detector is particularly used to prevent storage of, or acting upon, data in transition into or out of a bubble device at the time of an event.

Figure 4:
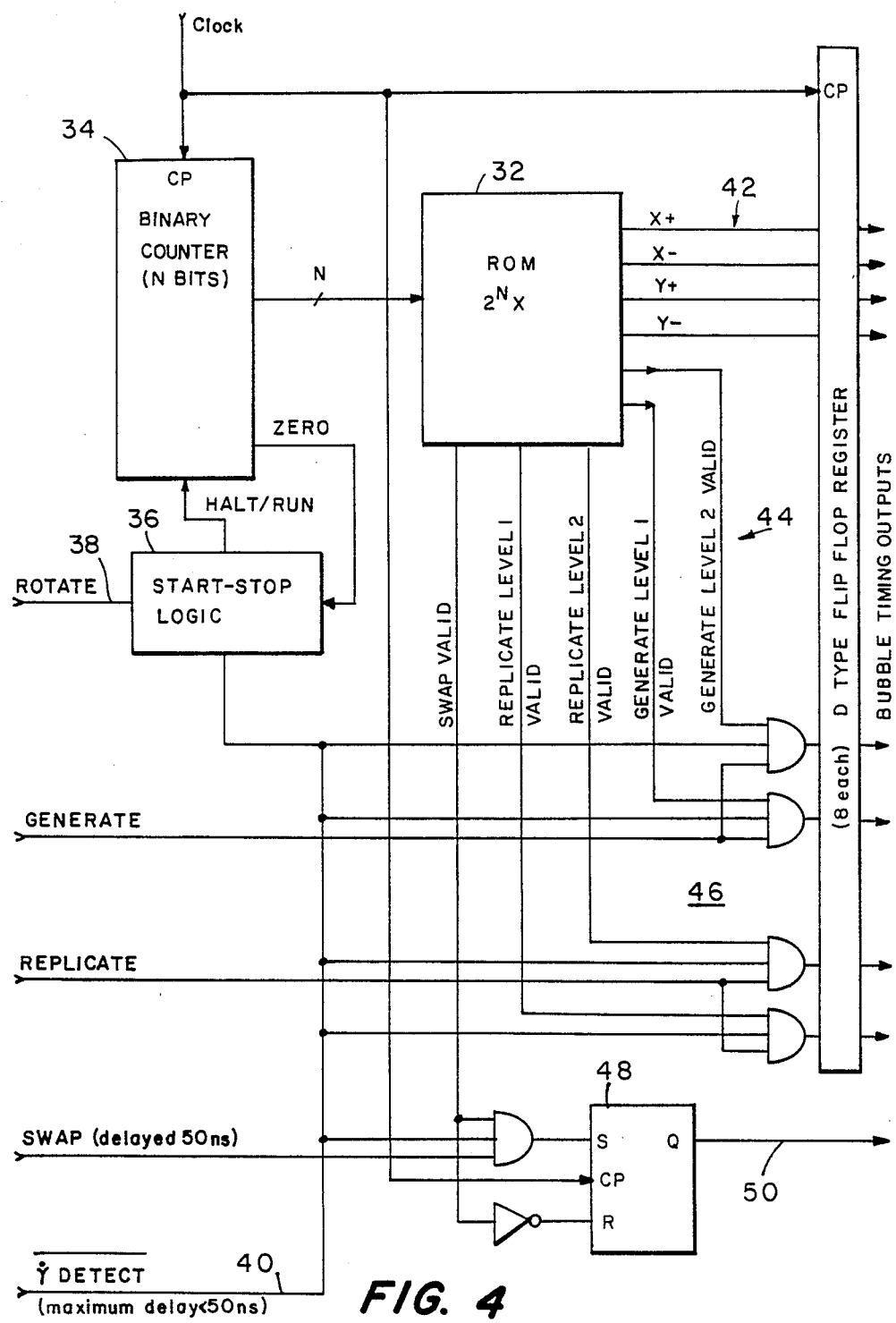
FIG. 4 provides a detailed representation of one possible arrangement of the nonstop logic illustrated in FIG. 3.

In FIG. 4 there is shown an arrangement for assuring that X-Y propagation, once started, revolves a complete 360 degrees to its start (i.e., a known reference position) before halting. This circuit further prevents spurious generation of swap pulses due to radiation induced transients. Moreover, by using digital timing, the swap, generate and replicate pulses retain their timing relative to the coil drive. The arrangements of FIGS. 8A–8F maintain current drive amplitudes within acceptable limits even during the transient events.

In FIG. 4, a radiation hardened ROM 32 stores data describing signal strength for signals to be applied to the drive coils for rotating the magnetic field. In accordance with the invention, a hardened binary counter 34 accesses ROM 32 and provides addresses from which to read the data for generating the appropriate magnetic field vector. Counter 34 is triggered by start-stop logic 36, which is responsive to a rotate signal provided on a line 38, and counts in accordance with a clock signal input thereto from the clock 28.

An event signal is generated by a nuclear event detector (not shown) and is provided on line 40 to start-stop logic 36. Thus, upon generation of a rotate signal by the bubble memory controller, logic 36 initiates counter 34 which then proceeds to access the sequential addresses of ROM 32, storing the successive data identifying the X and Y fields to be generated for rotation of the magnetic field vector. Concurrent with the appropriate phasing of the X and Y fields, data for generating swap, replicate, and generate fields is also generated.

Upon zero detection of a zero count of counter 34, logic 36 changes state, thus disabling the counter and terminating access of the ROM providing that a subsequent rotate signal is not received. Such operation continues so long as no nuclear event is detected. If an event signal is detected on line 40, a flag is set in logic 36 to prevent further response to a rotate signal.

ROM 32 thus outputs the actual drive signals for the X and Y coil drivers on lines 42. Additionally, output signals are provided on lines 44 in synchronism with the drive signals. The synchronized output signals on lines 44 are used for timing of the generate, replicate and swap signals. A logic circuit 46 is provided to validate and transmit the replicate, generate and swap signals from the bubble memory controller to the memory module coil drivers. As will be appreciated from the arrangement shown in FIG. 4, the output of the AND gates forming the logic circuit 46 transmit the value of the input signal thereto only when the synchronized signal from ROM 32 validates timing thereof and when an event signal is not provided from the nuclear event detector.

In order to assure that an event-generated swap signal is not transmitted to the memory module, a delay is provided in the swap line. The delay is greater than the delay of the nuclear event detector output event signal, or circumvention signal. Thus, a swap pulse from the bubble memory controller which is caused by, or concurrent with, a gamma transient is ignored by the nonstop logic. Specific values of delay may be 50 ns for the swap line, while the nuclear event detector circumvention signal delay may be 20 ns.

As shown in FIG. 4, the swap signal is passed by a flip-flop 48 and the signal provided on the output line 50 of the flip-flop represents a swap signal occurring separately from a nuclear event. The signal is maintained in a single logic state for the duration of the swap valid signal output by ROM 32.

Thus, the structure of FIG. 4 will accept commands from the bubble memory controller and will begin a cycle with a rotate command, followed by the generate, swap or replicate signals, depending on the type of cycle called for by the bubble memory controller. The state machine within the nonstop logic completes the timing for each 360 degree cycle with no further action by the bubble memory controller. Detection of a gamma pulse causes the ongoing cycle to be completed, but inhibits subsequent cycles until the entire support system recovers and resets the event signal representing a gamma event detection. Where resolution of one part in 128 is desired, 7 bits are sufficient to provide the current machine state. With additional registers required to store the output data, approximately 16 flip-flops suffice to comprise the nonstop logic. The present invention thus permits use of a minimal number of flip-flops for working through a nuclear event.

The above-described arrangement accordingly keeps timing logic simple and defines a minimal set of logic which may be used to maintain operation throughout an event.

Figure 5:
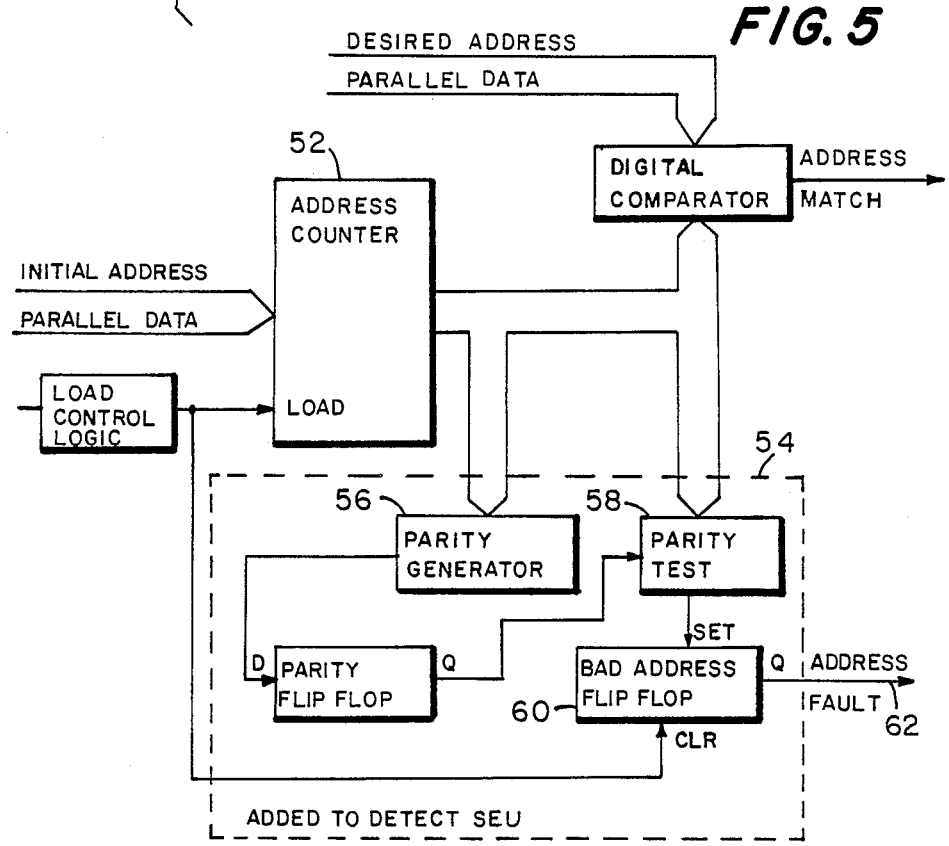
FIG. 5 shows a modification of the bubble memory controller of FIG. 2 in accordance with the invention.

Referring now to FIG. 5, illustrated therein is one embodiment for keeping track of bubble addressing. More specifically, a single event upset (SEU) can affect stored bubble data by affecting the bubble memory controller logic which keeps track of the bubble address. The logic shown in FIG. 5, which keeps track of rotations applied to the bubble X-Y field from the index read from the bubble, does so by finding an index mark once upon startup initialization rather than by re-reading the index mark for each access.

Thus, access time on subsequent bubble accesses is reduced by the use of a tracking address counter 52 If counter 52 should lose state due to a SEU, all succeeding accesses would be to the wrong address. Accordingly, there is provided a parity defining arrangement 54, including a parity generator 56 and parity tester 58. If tester 58 detects a bad parity status, a flip-flop 60 is set to output an address fault output signal on line 62.

A single bit of parity suffices to detect a single event upset inasmuch as a SEU, by its very localized nature, affects only a single flip-flop, or a single bit, thus making single bit parity highly reliable in detection of SEU. Of course, it is recognized that by addition of still further parity bits, correction of addressing errors due to single event upsets may be provided, as well as correction of multiple errors due to multiple event upsets.

Figure 6:
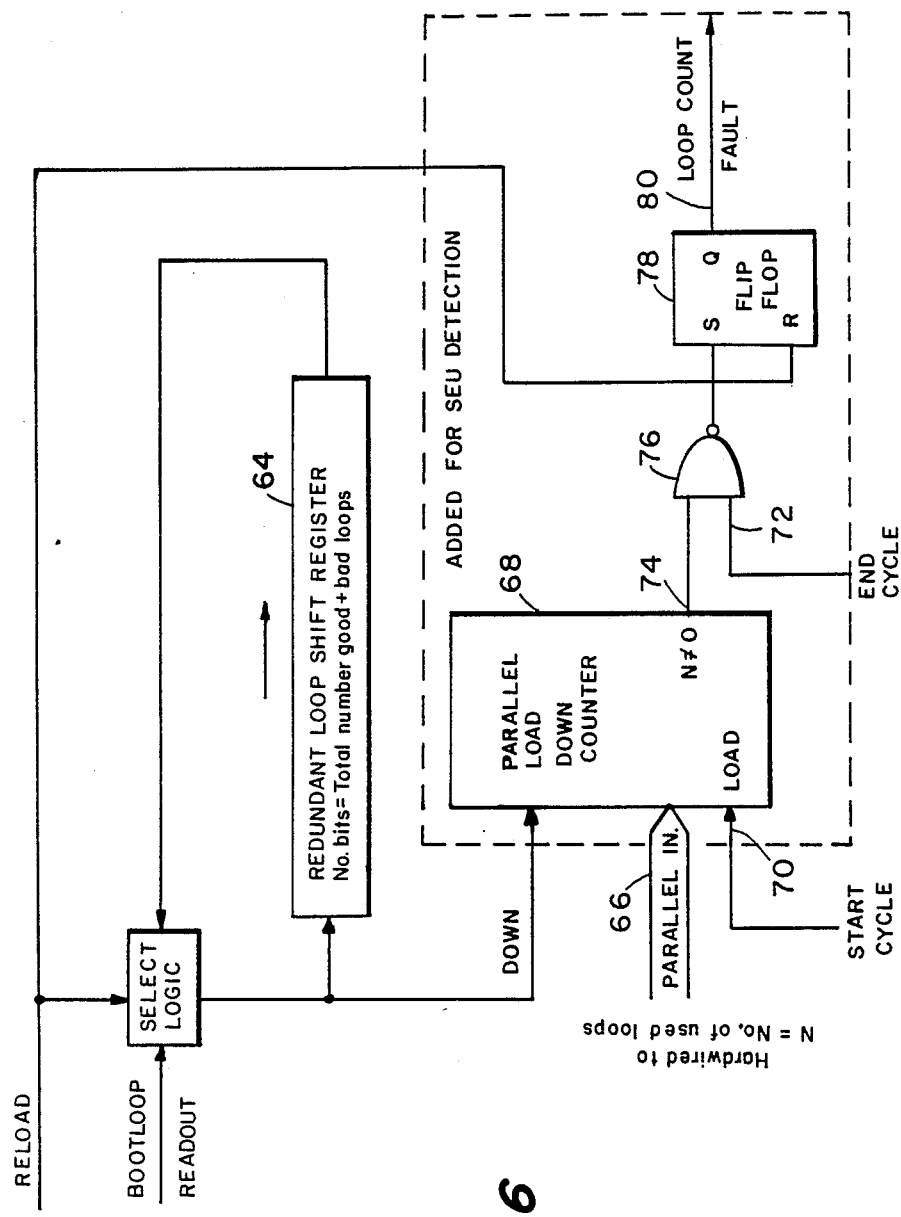
FIG. 6 shows a modification of the formatter of FIG. 2, in accordance with the invention.

Referring now to FIG. 6, there is shown an arrangement which may be used in conjunction with the formatter 24 of a bubble memory support chip. More particularly, redundant loop codes are used in a bubble memory to keep track of the number of useful loops in the bubble device. Such codes are stored in a redundant loop shift register 64. Such codes are stored outside the bubble device. If the data is stored in ROM 32 of FIG. 4, which may be used for fast startup recovery systems, no SEU effect will occur. However, if the codes are stored in and read from the bubble device itself, a possibility exists that the codes may be altered by SEU.

To avoid this possibility, the data is required to be scanned for each bubble access. Accordingly, the number of ones corresponding to good loops is counted. If this number disagrees with the correct value thereof, the redundant loop fault flip-flop is set and the redundant loop code must be re-read prior to permitting further access to the bubble memory device.

In the structure of FIG. 6, the number N of good loops being used is provided at 66 as a hard wired parallel input to a counter 68. On starting a cycle of reading the number of externally stored ones representing the number of good loops, a start cycle signal is provided to counter 68 at its load input 70. As each "one" is counted, counter 68 is counted down, until the end of the count is indicated by an end cycle signal 72.

If an output 74 of counter 68 indicates that the count stored therein is not zero at the end of the count cycle, the correct count prestored therein and the actually counted number of loops disagree. Accordingly, an AND gate 76 sets a flip-flop 78 to output a signal on output line 80 indicating a loop count error.

By providing the two arrangements of FIGS. 5 and 6, or other similar arrangements, in combination with the nonstop logic, SEU problems in a bubble memory are essentially eliminated.

Figure 7:
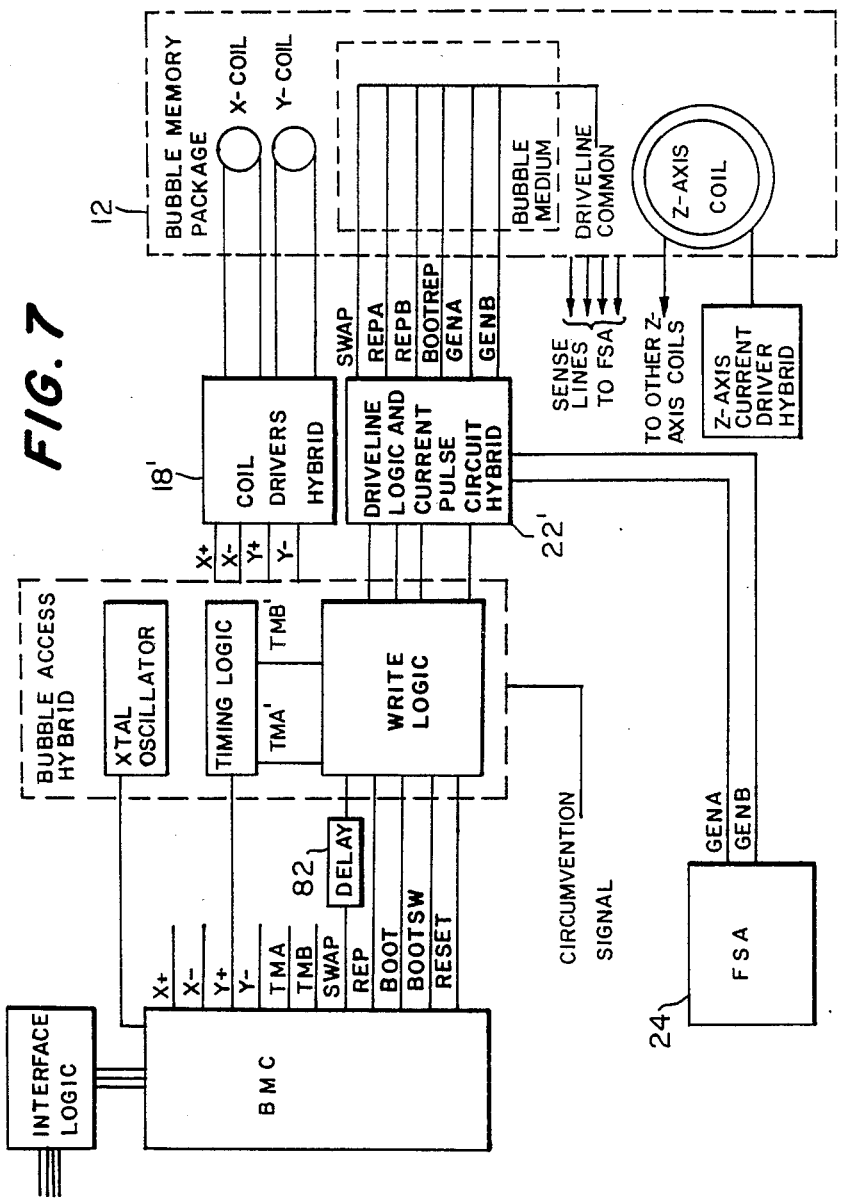
FIG. 7 shows another embodiment of the invention, including both a logic and hardened drivers.

Referring now briefly to FIG. 7, there is shown an alternate embodiment of the invention Therein, a delay 82 is shown in the swap line Moreover, the coil drivers 18', as well as driveline logic and current pulse generator 22' are indicated by primes to emphasize that the same are formed using additional hardening techniques.

Thus, as shown in FIG. 8A, the drive circuits for X and Y coils are illustrated. Such circuits generate currents for propagating bubbles within the bubble device. The currents are calibrated by using a known inductance of the coils and applying a fixed voltage thereacross for a measured time to obtain a current waveform as shown in FIG. 8B, showing at 84 permitted tolerances responsive to radiation upsets. In view of the inductance of the coils, passive filtering is inherent in the circuit. Photocurrent transients (flow of charge caused by transient irradiation of the transistors) which may upset the bridge circuit driving each coil generates only a slight variation in current, if the transient effects are of short duration.

Thus at 86 is shown a bypass capacitor to shorten any such transient effects, while at 88 is shown a zener diode, to provide zener clamping of the power supply pins.

The transistors used in FIGS. 8A, 8C and 8E are, preferably, each of small geometry That is, by reducing the geometry of the transistor, the magnitudes of any photocurrents generated by nuclear events are reduced Thus, for the driving transistors, transistors are used which are just large enough to provide the peak required collector current. That is, transistors used to drive 100 mA will be transistors having rated current carrying capacity of 100–200 mA, rather than 500–1000 mA, for example. In other words, the ratings of the transistors used in these circuits is preferably much closer to the actual current handling requirement than is normally practiced in commercial design.

The drive circuits for the replicate or generate lines in the bubble device are shown in FIG. 8C. In view of a unique property of these circuits, a further approach is used to minimize still further the effects of any photocurrents generated in the drive transistors 90.

The generate and replicate lines are driven with sufficient current to cause one or more bubbles to divide into two bubbles. However, the drivelines on the bubble substrate have negligible inductance and thus conduct photocurrent transients, as well as normal pulses. However, as has been hereinabove noted, complete accuracy of the replicate and generate line signals is not required. Thus, the tolerance limit for the pulse amplitude, in a negative direction, is 100%. That is, the pulse amplitude may be reduced to zero without adversely affecting permanent operation of the bubble memory. This is due to the fact that only bubbles entering or leaving the bubble device are affected by these pulses.

Moreover, in view of the circuitry shown at 46 in FIG. 4, the pulses are ignored whenever a nuclear transient is detected. Thus, complete elimination of the pulse is not at all detrimental However, excessive pulse amplitude could conceivably generate free bubbles which could contaminate the stored data.

Thus, tolerance in the positive direction is more limited, as illustrated by 92 in FIG. 8D.

In order to limit an increase in pulse amplitude, but not a decrease therein, a photocurrent overdrive circuit is used, including a large semiconductor device (transistor or diode) 94, arranged to shunt current from transistors 90 away from the bubble device. Therein, device 94 is arranged in a normally OFF condition. Thus, no photocurrent is generated or shunted thereby from the bubble device However, because of the larger geometry and size of device 94, any photocurrent generated thereby in response to a nuclear event will be larger than the similarly generated current in the smaller geometry transistors 90. Accordingly, any photocurrents generated by transistors 90 will be shunted by device 94 around the bubble device. Indeed, the current shunted by transistor 94 will be larger than the photocurrent induced in the transistors 90. Accordingly, the magnitude of the pulse generated by transistors 90 will not increase with radiation but, instead, will decrease.

Further, a short time constant RC low pass filter 96 is used in order further to reduce the driveline transients.

Still another particular condition exists with respect to the swap line driving circuit, shown in FIG. 8E. The swap lines act directly upon the stored bubble data, moving new data into the storage loops at appropriate times. Similarly to the replicate and generate lines, the swap line has no inductance and, accordingly, no built-in passive filtering.

Unlike the replicate and generate lines, however, the swap line pulse must always be within a limited tolerance of the nominal value, as shown in FIG. 8F. That is, a present pulse cannot properly be represented by no pulse, as permitted for the replicate and generate lines.

Accordingly, in FIG. 8E there is also used a constant current pulsed transistor 90, preferably of small geometry. However, in view of the different requirements for the swap line, a separate shunt circuit is provided therefor. More particularly, as shown in the figure, a matched transistor 98 is provided, connected in a normally OFF manner and shunting the output of transistor 90 from the bubble device to ground.

Thus, upon occurrence of a nuclear event and generation of photocurrent in transistor 90, transistor 98, matched thereto, will generate a substantially identical photocurrent. Accordingly, the increased current of transistor 90 will be shunted from the bubble device by transistor 98. Matching to within 10% is achieved by using matched transistors from adjacent wafer locations. Moreover, RC filter 96 may be used, similarly to use thereof in FIG. 8C.

It is noted that compensation for the Z axis current, where mandated for temperature compensation, is essentially a steady state current over the maximum time of a photocurrent response. This axis is driven by high inductance coils providing inherent low pass filtering Accordingly, the circuit design for the Z axis driver will include features to slow the response thereof still further, and to protect against burnout. Otherwise, the design of the Z axis drive is not particularly critical.

Figure 9:
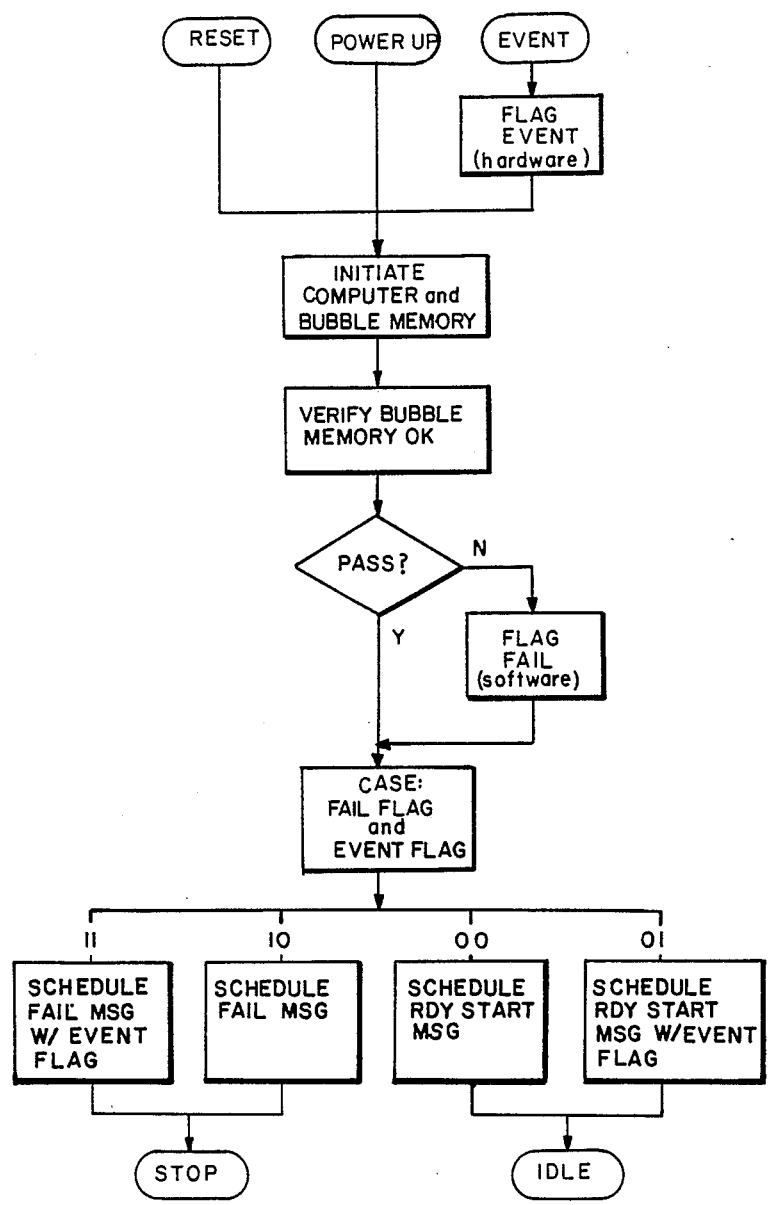
FIG. 9 shows a sequence of operations for restarting operations after a nuclear event.

Referring now to FIG. 9, a power restart technique is shown for the magnetic bubble memory. Particularly, due to the fact that so many logic states are present in a computer, it is impractical to make a complete system of computers with bubble memories totally immune to dose rate upset.

Accordingly, the nonstop logic of the present invention ignores even its own controller after sensing a gamma transient by the nuclear event detector. The standard bubble chip set architecture supports rapid restart after an event. All address and bit mapping states of the bubble memory controller are presumed lost. Recovery from a nuclear event is thus identical as that for power loss recovery. Each bubble device bootloop is read for redundant loop codes and stopped at the address index. Command registers are reset and the bubble memory awaits the next computer command.

By using a nuclear event detector which stores the occurrence of a gamma pulse, the startup sequence shown in FIG. 9 is made possible The program illustrated in the flow chart permits the computing system to recover intelligently and to perform the required operations for either a power interruption or a nuclear event. In either case, the bubble memory is available for program downloading.

When it is necessary to bring the overall system back on line with the ability to know what the system was previously doing and for how long it had been stopped, the ability of the bubble memory to protect its stored data at the onset of the event permits such a recovery with the addition of a battery backed up hardened RAM, a nonstoppable real time clock, and/or communication with other systems not affected by the event.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

I claim:

1. A radiation hardened magnetic bubble memory comprising:
   a bubble memory device;
   a bubble memory control means for tracking and controlling movement of data in, input of data to, and output of data from said bubble memory device;
   bubble drive circuits responsive to said bubble memory control means for providing field generating currents for said bubble memory device; and
   nonstop logic means connected between said bubble memory control means and said bubble drive circuits for passing control signals generated by said bubble memory control means to said bubble drive circuits,
   said nonstop logic means including radiation hardened terminating means responsive to detection of occurrence of a nuclear event for assuring that a rotating magnetic field applied to said bubble memory device prior to occurrence of said nuclear event completes a full rotation thereof and for preventing initiation of a further rotation thereof until termination of said nuclear event,
   said nonstop logic means thereby operable for providing internally generated field rotation signals to said bubble memory device in response to detection of a nuclear event,
   whereby data stored in said bubble memory device is reliably returned to a known accessible state in the presence of a nuclear event.

2. A radiation hardened magnetic bubble memory as recited in claim 1, wherein said nonstop logic means is further operable during a nuclear event for blocking replicate and generate fields from being generated in response to said bubble memory control means, thereby ignoring data errors occurring in data input to or output from said bubble memory device during a nuclear event.

3. A radiation hardened magnetic bubble memory as recited in claim 2, wherein said nonstop logic means includes means for passing replicate and generate field signals generated by said bubble memory control means to said bubble memory device only in the absence of a nuclear event.

4. A radiation hardened magnetic bubble memory as recited in claim 2, wherein said nonstop logic means includes radiation hardened swap signal generating means for providing an internally generated swap field generating signal to said bubble memory device only when a swap signal from said bubble memory control means has been verified.

5. A radiation hardened magnetic bubble memory as recited in claim 1, wherein said nonstop logic means includes radiation hardened swap signal generating means for providing an internally generated swap field generating signal to said bubble memory device only when a swap signal from said bubble memory control means has been verified.

6. A radiation hardened magnetic bubble memory as recited in claim 5 wherein said swap signal generating means includes logic means for verifying a swap signal generated by said bubble memory control means and means for producing said internally generated swap field generating signal upon verification that said swap signal is provided in a time interval different from an interval of a nuclear event.

7. A radiation hardened magnetic bubble memory as recited in claim 1 further comprising means for conveying an event signal indicative of a nuclear event, said event signal generated after a time period shorter than a predetermined maximum time period subsequent to occurrence of a nuclear event, and
   delay means provided in a swap signal line from said bubble memory control means to said nonstop logic means for delaying a swap signal generated by said bubble memory control means by a delay at least as long as said predetermined maximum time period.

8. In a magnetic bubble memory, the improvement comprising hardening means for hardening only critical drive signals for a bubble memory device of said memory, said hardening means including nonstop logic means for assuring that a rotating magnetic field applied to said bubble memory device prior to occurrence of a nuclear event completes a full rotation thereof and for preventing initiation of a further rotation thereof until termination of said nuclear event, said nonstop logic means comprising:
   means for conveying an event signal indicative of a nuclear event,
   storage means for storing a complete set of signals designating a complete set of X and Y field strengths to be provided to said bubble memory device for rotating a magnetic field therein through a full rotation,
   counter means by a rotate signal generated by a bubble memory control means and responsive to a clock signal for accessing said set of X and Y field strengths in sequence and providing signals representative thereof to bubble drive circuit means, and logic means responsive to a predetermined count of said count means and to said event signal for stopping said counter means at said predetermined count for a time period during which said event signal is being generated.

9. An improved magnetic bubble memory as recited in claim 8, wherein said nonstop logic means further comprises transmitting means for transmitting generate and replicate signals from said bubble memory control means to said bubble drive circuit means, said transmitting means including means responsive to said event signal for transmitting said generate and replicate signals to said bubble drive circuit means only when a nuclear event is not detected.

10. An improved magnetic bubble memory as recited in claim 9, further comprising delay means on a line transmitting a swap signal from said bubble memory control means to said bubble drive circuit means, said delay means having a delay period in excess of a maximum delay period of said event signal, and logic means for providing an internally generated swap signal to said bubble drive circuit means only after termination of a nuclear event as determined by a condition wherein said event signal has terminated and said swap signal is active.

11. An improved magnetic bubble memory as recited in claim 8, further comprising redundant loop register fault detecting means, said fault detecting means comprising counting means for counting a number of loops being used, said counting means being triggered by a start cycle signal, and means for outputting a loop count fault signal when an end cycle signal does not coincide with an indication by said counting means of a count corresponding to the number of loops.

12. An improved magnetic bubble memory as recited in claim 8, further comprising minimizing means for minimizing in bubble drive lines of said bubble memory device photocurrents generated by nuclear events, said minimizing means comprising:

drive transistors, having geometries capable of conducting current levels substantially equal to peak currents required thereof, thereby incorporating in said minimizing means drive transistors having ratings approximately equal to said peak currents.

13. An improved magnetic bubble memory as recited in claim 12, further comprising large geometry semiconductor means substantially shunting an output of a small geometry drive transistor, said large geometry semiconductor means connected in a normally OFF condition and capable of generating a large photocurrent responsively to a nuclear event, said large geometry semiconductor means thereby operable for shunting from the bubbles of said bubble memory device increases in current in said small geometry transistor due to nuclear event induced photocurrents therein.

14. An improved magnetic bubble memory as recited in claim 13, further comprising limiting means for limiting currents in bubbles of said bubble memory device to be within predetermined tolerances of nominal values thereof, said limiting means comprising first constant current transistor means driving a current through a bubble of said bubble memory device, and second normally OFF transistor means, substantially matched to said first constant current transistor means, said second normally OFF transistor means shunting a current approximately equal to the photocurrent output of said first constant current transistor means from the bubble of said bubble memory device, said matched second transistor means connected for normally shunting a photocurrent current level provided from the output of said first transistor means to the bubble of said bubble memory device, said matched second transistor means thereby operable for shunting substantially all nuclear event induced photocurrent generated by said first transistor means from the bubble.

15. An improved magnetic bubble memory as recited in claim 14 further comprising filter means for eliminating photocurrent spikes generated in said small geometry drive transistors, said filter means operable for shunting said photocurrent spikes to ground prior to introduction to said bubbles of said bubble memory device.

16. An improved magnetic bubble memory as recited in claim 14, wherein said large geometry semiconductor means is incorporated in a replicate or generate signal drive circuit of said bubble drive circuit means, and said matched first and second transistor means are incorporated in a swap signal drive circuit of said bubble drive circuit means, thereby maintaining said swap signal provided to a bubble within predetermined tolerance levels and maintaining said replicate or generate signals at levels equal to or less than predetermined maximum acceptable values therefor.

17. In a magnetic bubble memory, the improvement comprising hardening means for hardening only critical drive signals for a bubble memory device of said memory, said hardening means including nonstop logic means for assuring that a rotating magnetic field applied to said bubble memory device prior to occurrence of a nuclear event completes a full rotation thereof and for preventing initiation of a further rotation thereof until termination of said nuclear event, parity means connected to an address counting means of said bubble memory device for preventing writing into erroneous addresses after a single event upset, said parity means comprising parity generating means for generating a parity code for addresses of said bubble memory device generated by said address counting means and parity testing means for testing parity of an address applied to said bubble memory device and for generating a signal indicating a parity error to disable accessing an address location of said bubble memory device.

18. In a magnetic bubble memory, the improvement comprising hardening means for hardening only critical drive signals for a bubble memory device of said memory, said hardening means including nonstop logic means for assuring that a rotating magnetic field applied to said bubble memory device prior to occurrence of a nuclear event completes a full rotation thereof and for preventing initiation of a further rotation thereof until termination of said nuclear event, parity means connected to an address counting means of said bubble memory device for preventing writing into erroneous addresses after a single event upset, and redundant loop register fault detecting means, said fault detecting means comprising counting means for counting a number of loops being used, said counting means being triggered by a start cycle signal, and means for outputting a loop count fault signal when an end cycle signal does not coincide with an indication by said counting means of a count corresponding to the number of loops.

* * * * *